(12) United States Patent
Wan et al.

(10) Patent No.: US 12,278,114 B2
(45) Date of Patent: Apr. 15, 2025

(54) MANUFACTURING METHOD OF SEMICONDUCTOR STRUCTURE

(71) Applicant: CHANGXIN MEMORY TECHNOLOGIES, INC., Hefei (CN)

(72) Inventors: Qiang Wan, Hefei (CN); Jun Xia, Hefei (CN); Kangshu Zhan, Hefei (CN); Sen Li, Hefei (CN); Penghui Xu, Hefei (CN); Tao Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 533 days.

(21) Appl. No.: 17/648,582

(22) Filed: Jan. 21, 2022

(65) Prior Publication Data
US 2022/0310402 A1 Sep. 29, 2022

Related U.S. Application Data

(63) Continuation of application No. PCT/CN2021/120321, filed on Sep. 24, 2021.

(30) Foreign Application Priority Data

Mar. 25, 2021 (CN) .......................... 202110320475.9

(51) Int. Cl.
H01L 21/311 (2006.01)
H01L 21/02 (2006.01)
(52) U.S. Cl.
CPC .... *H01L 21/31111* (2013.01); *H01L 21/0214* (2013.01); *H01L 21/02164* (2013.01); *H01L 21/0228* (2013.01); *H01L 21/31144* (2013.01)
(58) Field of Classification Search
CPC ........... H01L 21/31111; H01L 21/0214; H01L 21/02164; H01L 21/0228; H01L 21/31144
(Continued)

(56) References Cited

U.S. PATENT DOCUMENTS 7,081,413 B2 7/2006 Chan et al.
2005/0087809 A1* 4/2005 Dokumaci .......... H01L 21/0332
438/689
(Continued)

FOREIGN PATENT DOCUMENTS

CN 113078058 A 7/2021
JP 2013089801 A 5/2013

OTHER PUBLICATIONS

Machine English Translation of JP 2013/089801. (Year: 2013).*
International Search Report cited in PCT/CN2021/120321 mailed Dec. 24, 2021, 11 pages.

*Primary Examiner* — Dzung Tran
(74) *Attorney, Agent, or Firm* — Syncoda LLC; Feng Ma

(57) ABSTRACT

The present disclosure provides a manufacturing method of a semiconductor structure, including: an insulating layer includes a first dielectric layer and a second dielectric layer, a protective layer covers an upper surface of the second dielectric layer and a bottom and sidewalls of the first trench; removing part of the protective layer to expose at least part of a surface of the second dielectric layer; removing the second dielectric layer by a first wet etching process, the first wet etching process has a first etch selectivity of a material of the second dielectric layer to that of the first dielectric layer; and removing the protective layer by a second wet etching process, the second wet etching process has a second etch selectivity of a material of the protective layer to that of the first dielectric layer, and the second etch selectivity is greater than the first etch selectivity.

18 Claims, 8 Drawing Sheets

(58) Field of Classification Search
USPC .......................................................... 438/702
See application file for complete search history.

(56) References Cited

U.S. PATENT DOCUMENTS

| | | | |
|---|---|---|---|
| 2007/0148863 A1 | 6/2007 | Seo et al. | |
| 2012/0276747 A1* | 11/2012 | Oh .................... | H01L 21/31138 |
| | | | 438/723 |
| 2016/0035571 A1* | 2/2016 | Chang ............... | H01L 21/02282 |
| | | | 438/703 |
| 2018/0218904 A1* | 8/2018 | Hsieh ................ | H01L 21/31144 |
| 2019/0164820 A1* | 5/2019 | Sun ................. | H01L 21/823475 |

\* cited by examiner

MANUFACTURING METHOD OF SEMICONDUCTOR STRUCTURE

CROSS-REFERENCE TO RELATED APPLICATIONS

The present disclosure is a continuation application of International Patent Application No. PCT/CN2021/120321, titled "MANUFACTURING METHOD OF SEMICONDUCTOR STRUCTURE" and filed on Sep. 24, 2021, which claims the benefit and priority to Chinese Patent Application No. 202110320475.9, titled "MANUFACTURING METHOD OF SEMICONDUCTOR STRUCTURE" and filed on Mar. 25, 2021. The entire contents of International Patent Application No. PCT/CN2021/120321 and Chinese Patent Application No. 202110320475.9 are incorporated herein by reference.

TECHNICAL FIELD

The present disclosure relates to, but are not limited to a manufacturing method of a semiconductor structure.

BACKGROUND

In the process of manufacturing the semiconductor structure, dry and wet etching processes may be selected according to actual requirements. In the dry etching process, reactive gases and plasma are mainly used to etch and remove materials in specific regions. In the wet etching process, chemical reagents are mainly used to react with to-be-etched materials to etch and remove exposed specific materials. Compared with the dry etching process, the wet etching process has a relatively high etch selectivity. In the actual processes, when the dry and wet etching processes are used to obtain the target pattern, the morphology of the finally obtained target pattern is often abnormal due to the etch selectivities of different materials.

SUMMARY

Embodiments of the present disclosure provide a manufacturing method of a semiconductor structure, including: providing a substrate; forming an insulating layer on the substrate, where the insulating layer includes a first dielectric layer and a second dielectric layer, the insulating layer includes a first trench, and the second dielectric layer covers an upper surface of the first dielectric layer; forming a protective layer, where the protective layer covers an upper surface of the second dielectric layer and a bottom and sidewalls of the first trench; removing part of the protective layer to expose at least part of a surface of the second dielectric layer; removing the second dielectric layer by using a first wet etching process, where the first wet etching process has a first etch selectivity of a material of the second dielectric layer to a material of the first dielectric layer; and removing the protective layer by using a second wet etching process, where the second wet etching process has a second etch selectivity of a material of the protective layer to the material of the first dielectric layer, and the second etch selectivity is greater than the first etch selectivity.

BRIEF DESCRIPTION OF THE DRAWINGS

One or more embodiments are exemplified by corresponding accompanying drawings. The accompanying drawings are not limited by scale, unless otherwise specified.

DETAILED DESCRIPTION

Figure 1:
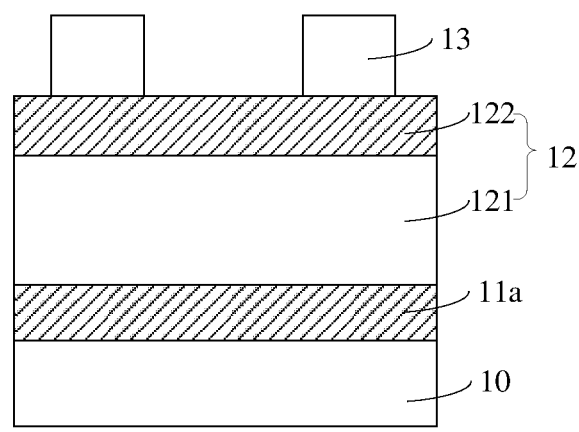
FIG. 1 to FIG. 7 are schematic structural diagrams corresponding to various steps of a manufacturing method of a semiconductor structure.

With reference to FIG. 1, a substrate 10, a first dielectric material layer 11a, a first sacrificial material layer 12, and a photoresist layer 13 that are stacked sequentially are provided. The photoresist layer 13 includes an opening pattern.

The first sacrificial material layer 12 is of a multi-layer structure. In some embodiments, the first sacrificial material layer 12 includes a first sacrificial sublayer 121 and a second sacrificial sublayer 122 that are stacked. The first sacrificial sublayer 121 is located between the first dielectric material layer 11a and the second sacrificial sublayer 122. Materials of the second sacrificial sublayer 122 and the first dielectric material layer 11a are the same.

Figure 2:
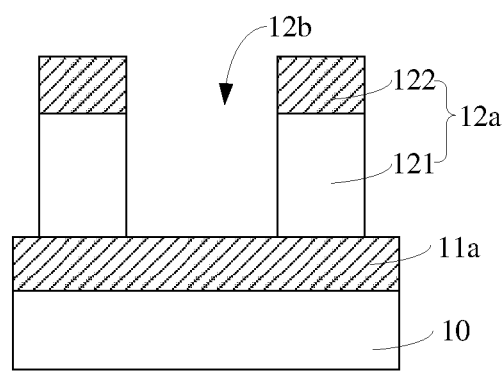

With reference to FIG. 2, part of the first sacrificial material layer 12 (with reference to FIG. 1) is etched and removed by using the photoresist layer 13 (with reference to FIG. 1) as a mask. The remaining first sacrificial material layer 12 is used as the first sacrificial layer 12a. The first sacrificial layer 12a includes a second trench 12b. After the first sacrificial layer 12a is formed, the photoresist layer 13 is removed.

Figure 3:
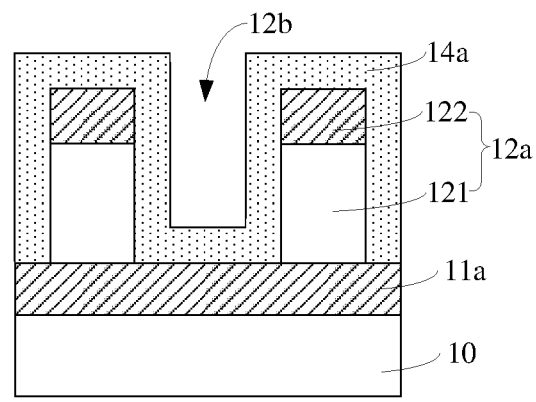

With reference to FIG. 3, a second dielectric material layer 14a is formed. The second dielectric material layer 14a covers an upper surface of the first sacrificial layer 12a and the bottom and sidewalls of the second trench 12b. The sidewalls of the second trench 12b is equivalent to that of the first sacrificial layer 12a.

Figure 4:
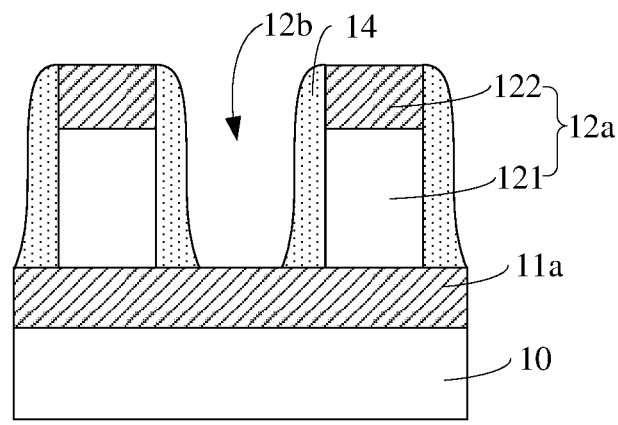

With reference to FIG. 4, the second dielectric material layer 14a (with reference to FIG. 3) on the upper surface of the first sacrificial layer 12a is removed. The second dielectric material layer 14a at the bottom of the second trench 12b is removed. The second dielectric material layer 14a on the sidewall of the first sacrificial layer 12a is retained. The remaining second dielectric material layer 14a is used as the second dielectric layer 14.

Figure 5:
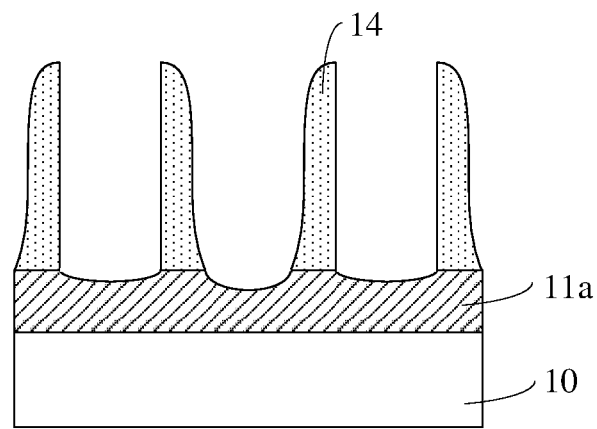

With reference to FIG. 5, the first sacrificial layer 12a is removed.

Because the materials of the second sacrificial sublayer 122 and the first dielectric material layer 11a are the same, the first sacrificial layer 12a is removed only by using a dry etching process. Because an etch selectivity of the dry etching process is relatively small, during the dry etching process, exposed surfaces of the first dielectric material layer 11a are over-etched. The "exposed surfaces" include a surface in contact with the first sacrificial layer 12a and a surface exposed by both the first sacrificial layer 12a and the second dielectric layer 14. The degree of being over-etched is related with the exposure time. A longer exposure time indicates a higher degree of being over-etched.

Figure 6:
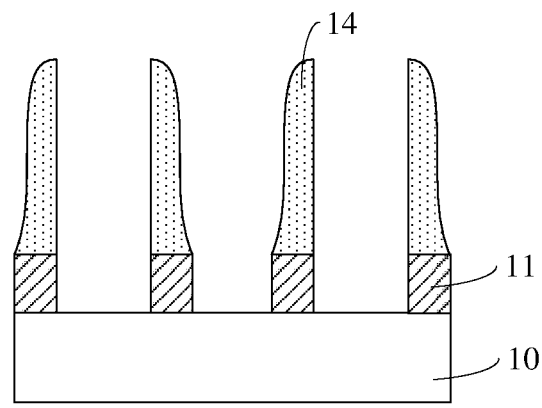

With reference to FIG. 6, the first dielectric material layer 11a (with reference to FIG. 5) exposed by the second dielectric layer 14 is removed. The remaining first dielectric material layer 11a forms a first dielectric layer 11.

Part of the first dielectric material layer 11a is etched and removed by using the second dielectric layer 14 as a mask. The first dielectric material layer 11a located between the second dielectric layer 14 and the substrate 10 is retained to form the first dielectric layer 11. The second dielectric layer 14 exposes a surface of a sidewall of the first dielectric layer 11.

Figure 7:
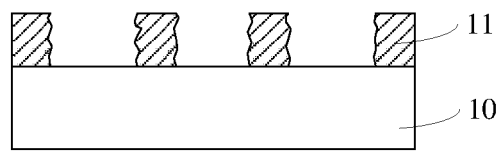

With reference to FIG. 7, the second dielectric layer 14 (with reference to 6) is removed by using a wet etching process.

Because the second dielectric layer 14 exposes the surface of the sidewall of the first dielectric layer 11, in the process of removing the second dielectric layer 14 by using the wet etching process, an etchant is in contact with the surface of the sidewall of the first dielectric layer 11, damaging the surface of the sidewall of the first dielectric layer 11. The wet etching process has an etch selectivity of a material of the second dielectric layer 14 and that of the first dielectric layer 11. A smaller etch selectivity indicates a higher roughness of the surface of the sidewall of the first dielectric layer 11. In a severe case, some defects such as burrs may be generated to affect the performance of the semiconductor structure.

In some embodiments, the material of the second dielectric layer 14 is silicon dioxide. The material of the first dielectric layer 11 is silicon oxynitride. The etchant of the wet etching process is ammonium hydrogen fluoride solution, which also etches the first dielectric layer 11 while removing the second dielectric layer 14, resulting in some defects such as burrs formed on the sidewall of the first dielectric layer 11.

In order to make the objectives, technical solutions and advantages of the embodiments of the present disclosure clearer, the embodiments of the present disclosure are described below with reference to the accompanying drawings. Those of ordinary skill in the art should understand that many technical details are proposed in each embodiment of the present disclosure to help the reader better understand the present disclosure. However, even without these technical details and various changes and modifications made based on the following embodiments, the technical solutions claimed in the present disclosure may still be realized.

Figure 8:
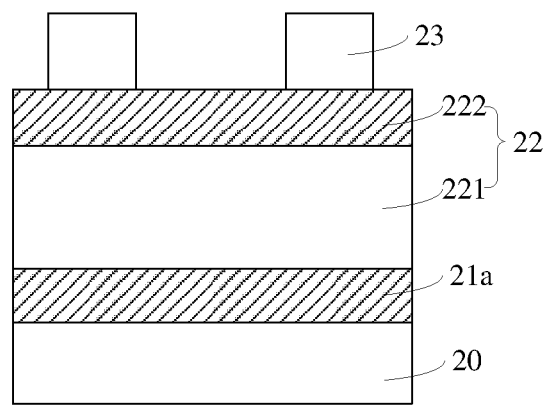
FIG. 8 to FIG. 17 are schematic structural diagrams corresponding to various steps of the manufacturing method of a semiconductor structure according to embodiments of the present disclosure.

FIG. 8 to FIG. 17 are schematic structural diagrams corresponding to various steps of the manufacturing method of a semiconductor structure according to embodiments of the present disclosure. The manufacturing method of a semiconductor structure includes the following steps:

With reference to FIG. 8, a substrate 20, a first dielectric material layer 21a, a first sacrificial material layer 22, and a photoresist layer 23 that are stacked sequentially are provided. The photoresist layer 23 includes an opening pattern.

The first sacrificial material layer 22 includes a first sacrificial sublayer 221 and a second sacrificial sublayer 222 that are stacked. The first sacrificial sublayer 221 is located between the first dielectric material layer 21a and the second sacrificial sublayer 222. The first sacrificial material layer 22 may include the material of the first dielectric material layer 21a. For example, the material types of the second sacrificial sublayer 222 and the first dielectric material layer 21a are the same.

In some embodiments, in a case that the material types of the second sacrificial sublayer 222 and the first dielectric material layer 21a are not changed, the material properties of the second sacrificial sublayer 222 or the first dielectric material layer 21a is changed by adjusting the atomic ratio of the material of the second sacrificial sublayer 222 or the first dielectric material layer 21a, so that the etch selectivity of the material of the second sacrificial sublayer 222 to that of the first dielectric material layer 21a is greater than 1 when the etchant is used, alleviating the damage on the first dielectric material layer 21a caused by the subsequent etching process for removing the second sacrificial sublayer 222.

In some embodiments, the material of the second sacrificial sublayer 222 is first silicon oxynitride. The material of the first dielectric material layer 21a is second silicon oxynitride. Both are silicon oxynitride materials. The concentration of silicon atoms in the second silicon oxynitride is greater than that in the first silicon oxynitride, and a hardness of second silicon oxynitride is greater than that of first silicon oxynitride. The selection of the silicon oxynitride material as the second sacrificial sublayer 222 is mainly to prevent the sawtooth standing wave effect from generating when the photoresist layer 23 is formed by using lithography technique, and further affect the morphology of the finally formed semiconductor device. In this case, the silicon oxynitride material has a relatively high hardness than the photoresist material (that is, the material of the photoresist layer 23), and can be used as a hard mask layer to avoid the etching of the photoresist material by the etchant, affect the accuracy of the opening pattern, and ensure that the position accuracy of the first sacrificial material layer 22 meets a preset requirement.

In addition, the material of the first sacrificial sublayer 221 is carbon or a carbon-containing organic matter. The carbon-containing organic matter includes a resin compound. The first sacrificial sublayer 221 can be removed by using an ashing process, to avoid the damage on the first dielectric material layer 21a caused by the removal process of the first sacrificial sublayer 221 and ensure that the first dielectric material layer 21a has good material properties.

It may be noted that the material of the first sacrificial sublayer 221 and the removal process of the first sacrificial sublayer 221 are merely examples for description. In the actual production process, the material of the first sacrificial sublayer 221 and the removal process of the first sacrificial sublayer 221 may be adjusted to prevent the components introduced by the removal process from reacting with the first dielectric material layer 21a or causing the bombardment damage on the first dielectric material layer 21a, to ensure that the first dielectric material layer 21a has good material properties and accurate morphology and that the morphology of the structure formed according to the first dielectric material layer 21a and its derivative film layer meets the preset requirements. The derivative film layer is formed by etching part of the material of the first dielectric material layer 21a.

Figure 9:
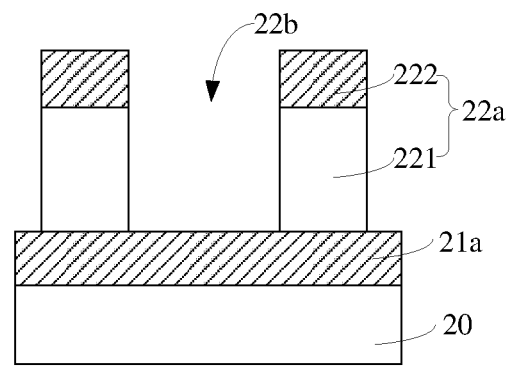

With reference to FIG. 9, part of the first sacrificial material layer 22 (with reference to FIG. 8) is etched and removed by using the photoresist layer 23 (with reference to FIG. 8) as a mask. The remaining first sacrificial material layer 22 is used as the first sacrificial layer 22a. The first sacrificial layer 22a includes a second trench 22b. After the first sacrificial layer 22a is formed, the photoresist layer 23 is removed.

In this embodiment, the first sacrificial sublayer 221 and the second sacrificial sublayer 222 are etched sequentially by using the photoresist layer 23 as a mask, to form the second trench 22b exposing the first dielectric material layer 21a. After the second trench 22b is formed, the photoresist layer 23 is removed. In this way, the first sacrificial sublayer 221 and the second sacrificial sublayer 222 are etched in one process step, reducing the etching steps and the process costs.

In other embodiments, the second sacrificial sublayer is etched first by using the photoresist layer as a mask to form an opening pattern exposing the top surface of the first sacrificial sublayer. After part of the second sacrificial sublayer is etched, the photoresist layer is removed. After the photoresist layer is removed, the first sacrificial sublayer is etched by using the remaining second sacrificial sublayer, having the opening pattern, as a mask to form the second trench. In this way, the removal process of the photoresist layer is likely to cause damage on the first dielectric material layer. The damage includes but is not limited to the changes of the morphology features and material properties of the first dielectric material layer.

It may be noted that the first sacrificial sublayer 221 and the second sacrificial sublayer 222 may be etched by using the same etchant or different etchants. In some embodiments, the materials of the first dielectric material layer 21a and the second sacrificial sublayer 222 belong to the same type. The difference of material properties between the first dielectric material layer 21a and the first sacrificial sublayer 221 is increased by adjusting the atomic ratio of the material of the first dielectric material layer 21a, and/or the difference of material properties between the first sacrificial sublayer 221 and the second sacrificial sublayer 222 is decreased by adjusting the atomic ratio of the material of the second sacrificial sublayer 222. Finally, the first sacrificial sublayer 221 and the second sacrificial sublayer 222 are etched by using the same etchant that does not damage the first dielectric material layer 21a, reducing the etching process and the process costs.

Figure 10:
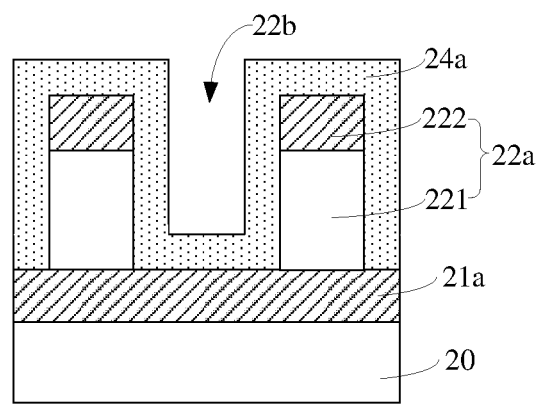

With reference to FIG. 10, a second dielectric material layer 24a is formed. The second dielectric material layer 24a covers an upper surface of the first sacrificial layer 22a and the bottom and sidewalls of the second trench 22b. The sidewalls of the second trench 22b is equal to that of the first sacrificial layer 22a.

In this embodiment, the second dielectric material layer 24a is formed by using an atomic layer deposition process, so that the thickness of the second dielectric material layer 24a accurately meets the preset requirement, the second dielectric layer formed by etching the second dielectric material layer 24a has relatively high position accuracy, and the first dielectric layer formed through etching by using the second dielectric layer as a mask has relatively high position accuracy. In addition, the second dielectric material layer 24a formed by using the atomic layer deposition process can have a relatively high thickness, that is, relatively high structural strength, thereby preventing the second dielectric layer from collapsing due to a loose structure.

In this embodiment, the material of the second dielectric material layer 24a is silicon dioxide with a relatively low price, which is conducive to reducing the costs of manufacturing the semiconductor structure. In addition, the texture of silicon dioxide is relatively soft, and therefore it is relatively fast to etch the silicon dioxide material, which is conducive to shortening the process time.

Figure 11:
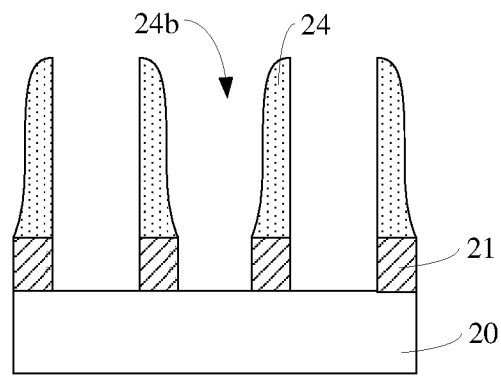

With reference to FIG. 11, the first dielectric layer 21 and the second dielectric layer 24 are formed.

In the direction perpendicular to the surface of the substrate 20, the second dielectric material layer 24a (with reference to FIG. 10) is etched by using a maskless dry etching process to remove the second dielectric material layer 24a on the upper surface of the first sacrificial layer 22a and at the bottom of the second trench 22b. The first sacrificial layer 22a is removed, and the remaining second dielectric material layer 24a forms the second dielectric layer 24.

The first dielectric material layer 21a (with reference to FIG. 10) is etched by using the second dielectric layer 24 as a mask, to remove the first dielectric material layer 21a exposed by the second dielectric layer 24. The remaining first dielectric material layer 21a forms the first dielectric layer 21. The second dielectric layer 24 covers the upper surface of the first dielectric layer 21. The first dielectric layer 21 and the second dielectric layer 24 form an insulating layer (not shown) including a first trench 24b.

It may be noted that of the finally formed second dielectric layer 24, the top surface and sidewall are both curved rather than being flat, and the width of the top surface is smaller than that of the bottom. The width of the bottom of the second dielectric layer 24 is equal to that of the top surface of the first dielectric layer 21.

Figure 12:
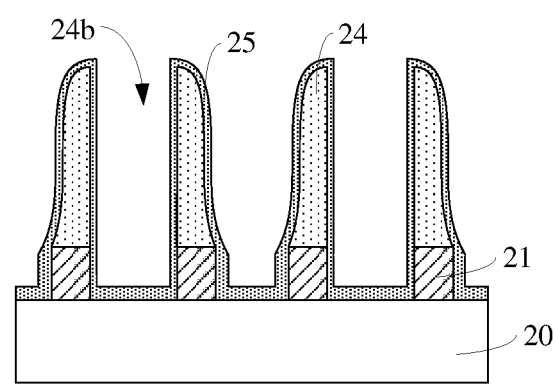

With reference to FIG. 12, a protective layer 25 is formed.

In this embodiment, the protective layer 25 is formed by using a deposition process. The protective layer 25 covers an upper surface of the second dielectric layer 24 and the bottom and sidewalls of the first trench 24b. In other words, the protective layer 25 covers surfaces exposed by the substrate 20, the first dielectric layer 21, and the second dielectric layer 24.

In some embodiments, the hardness of the material of the protective layer 25 is greater than that of the second dielectric layer 24. For example, the material of the protective layer 25 is silicon nitride with low costs. Because silicon nitride has a relatively high hardness, the protective layer 25 may be relatively thin, without worrying about the collapse problem due to an insufficiently strong structure. The relatively small hardness of the protective layer 25 is conducive to shortening the time of the subsequent etching for removing the protective layer 25, to shorten the contact time between the etchant and the first dielectric layer 21, alleviate the damage on the first dielectric layer 21, and shorten the whole manufacturing time of the semiconductor structure. In addition, such a relatively small hardness is further conducive to shortening the deposition formation time of the protective layer 25, thereby shortening the manufacturing time of the semiconductor structure. Furthermore, the relatively small hardness and the relatively low material price of the protective layer 25 are both conducive to reducing the manufacturing costs of the semiconductor structure.

In this embodiment, the protective layer 25 may be formed by using the atomic layer deposition process. The layers are deposited layer by layer by using the atomic layer deposition process, and the distance between adjacent atoms or molecules is small. Therefore, there are relatively large contact areas between the protective layer 25 formed by using the atomic layer deposition process and the surfaces of the first dielectric layer 21 and the second dielectric layer 24, with relatively high bonding strength. Before cured, the material of the protection layer 25 can better adhere to the surfaces of the first dielectric layer 21 and the second dielectric layer 24, to ensure the effective formation of the protective layer 25.

In this case, curing the material of the protective layer 25 is described as follows: the material of the protective layer 25 shows certain fluidity during the deposition process. In other words, such a material has relatively small particles. Therefore, the material of the protective layer 25, after deposited on the surfaces of the first dielectric layer 21 and the second dielectric layer 24, needs to be cured through heating or in another manner, to ensure that the protective layer 25 has relatively high structure strength.

In addition, at least one side surface of the second dielectric layer 24 is a curved surface instead of a vertical plane, which helps improve the effective adhesion rate of the material of the protective layer 25, prevent the material of the protective layer 25 from collapsing or slipping due to insufficient adhesion strength, and ensure effective formation of the protective layer 25.

In this embodiment, the thickness of the protective layer 25 is 5-10 nm such as 7, 8, or 9 nm. If the thickness of the protective layer 25 is excessively large, the deposition time is relatively long, and the raw material is wasted. If the thickness of the protective layer 25 is excessively small, the protective layer 25, with the relatively low structural strength, is prone to collapse, and with a relatively weak protective effect, may be removed or etched through during the removal process of the second dielectric layer 24, thereby exposing the sidewall of the first dielectric layer 21. As a result, the sidewall of the first dielectric layer 21 is damaged by the etchant of the second dielectric layer 24.

Figure 13:
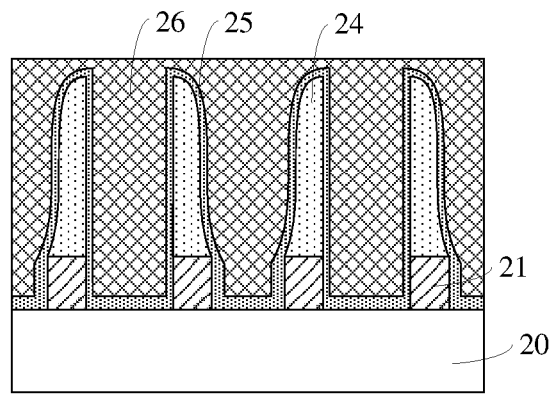

With reference to FIG. 13, a second sacrificial layer 26 is formed.

In this embodiment, before part of the protective layer 25 is removed to expose the second dielectric layer 24, the second sacrificial layer 26 is formed. The second sacrificial layer 26 fills the first trench (not shown) and covers a surface exposed by the protective layer 25. By disposing the second sacrificial layer 26, the protective layer 25 may be etched subsequently by using the maskless dry etching process, to expose the surface of the second dielectric layer 24, without additional masks, which is beneficial to reduce the process costs. In addition, by disposing the second sacrificial layer 26, the insulating layer (not shown) is unlikely to tip over when the protective layer 25 is etched by using the dry etching process, to ensure the stability of the semiconductor structure. In other embodiments, after the protective layer is formed, part of the protective layer is removed to expose at least part of the surface of the second dielectric layer.

In some embodiments, the hardness of the material of the second sacrificial layer 26 is smaller than that of the second dielectric layer 24. For example, the material of the second sacrificial layer 26 is carbon or a carbon-containing organic matter. The second sacrificial layer 26 may be removed by using the ashing process. In this way, it is beneficial to avoid the damage on the protective layer 25 and the first dielectric layer 21 during the removal process of the second sacrificial layer 26, and ensure good structural properties of the first dielectric layer 21.

It may be noted that if the protective layer 25 is grinded and etched by using a planarization process instead of the maskless dry etching process, other adjacent structures may be contaminated. This is because the texture of carbon or the carbon-containing organic matter is relatively soft and has certain fluidity. If the protective layer 25 is grinded and etched by using the planarization process, some of the material of the second sacrificial layer 26 may be thrown out during the grinding process, causing splashing pollution.

Figure 14:
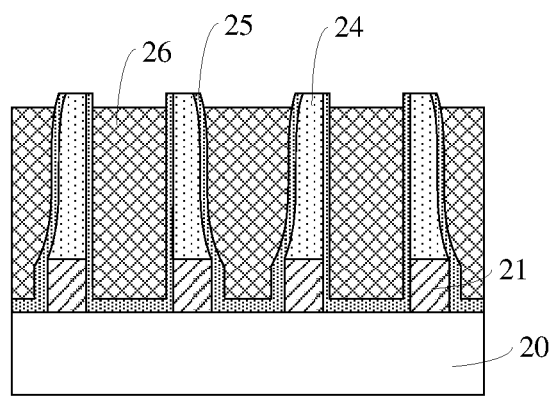

With reference to FIG. 14, part of the protective layer 25 is removed.

In this embodiment, in the direction perpendicular to the surface of the substrate 20, the second dielectric layer 24, the protective layer 25, and the second sacrificial layer 26 are etched by using the maskless dry etching process to remove part of each of the three layers. The upper surface of the remaining protective layer 25 is flush with that of the remaining second dielectric layer 24, that is, the protective layer 25 exposes the upper surface of the second dielectric layer 24. Because the texture of carbon or a carbon-containing compound is relatively soft and easy to remove, the upper surface of the remaining second sacrificial layer 26 is lower than that of the remaining protective layer 25.

Figure 15:
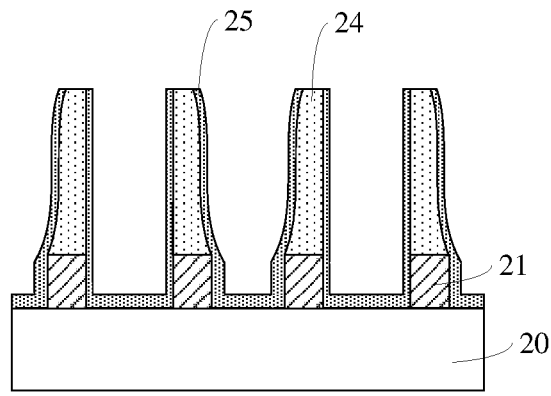

With reference to FIG. 15, the remaining second sacrificial layer 26 (with reference to FIG. 14) is removed.

In this embodiment, after the part of the surface of the second dielectric layer 24 is exposed, the remaining second sacrificial layer 26 is removed by using the ashing process. In this case, the second dielectric layer 24 protects and isolates the first dielectric layer 21, avoiding that the ashing process damages the top surface of the first dielectric layer 21 and that impurities formed by the ashing process adhere to the top surface of the first dielectric layer 21, thereby ensuring good properties of the first dielectric layer 21.

Figure 16:
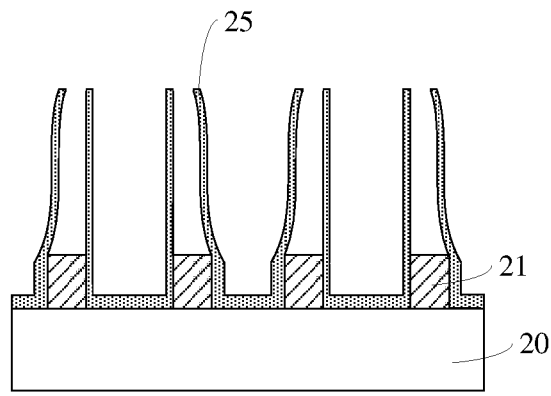

With reference to FIG. 16, the second dielectric layer 24 is removed by using a first wet etching process.

In this embodiment, a first etch selectivity of the material of the second dielectric layer 24 to that of the first dielectric layer 21 in the first wet etching process is 5:1-10:1 such as 6:1, 7:1, or 8:1. The etchant used by the first wet etching process includes ammonium hydrogen fluoride solution. Generally, the ammonium hydrogen fluoride solution is the mixed solution of ammonium fluoride and diluted hydrogen fluoride solution, and the mixed solution is generally used for etching to remove silicon dioxide. Because the etch selectivity is related to the ambient temperature in the etching process. A lower ambient temperature indicates a higher etch selectivity and less damage on other layers caused by the etchant. Therefore, to alleviate the damage on the top surface of the first dielectric layer 21 caused by the first wet etching process, which may be performed at a relatively low ambient temperature such as below 150° C.

Figure 17:
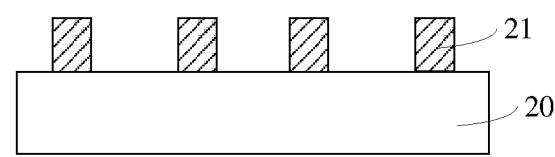

With reference to FIG. 17, the protective layer 25 (with reference to FIG. 16) is removed by using a second wet etching process.

In this embodiment, the second wet etching process has a second etch selectivity of the material of the protective layer 25 to that of the first dielectric layer 21. To alleviate the damage on the sidewall of the first dielectric layer 21 caused by the etching process, the second etch selectivity should be greater than the first etch selectivity. In some embodiments, the second etch selectivity may be set to 2-8 times such as 3, 5, or 7 times the first etch selectivity, thereby ensuring that the surface of the sidewall of the first dielectric layer 21 is relatively smooth.

It may be noted that if the ratio of the second etch selectivity to the first etch selectivity is set excessively large, the etch rate of the protective layer 25 may be relatively small, and the process time is relatively long. If the ratio is excessively small, the improvement of the structural properties of the sidewall of the first dielectric layer 21 is relatively weak, and the preset improvement effect cannot be achieved.

In this embodiment, an etch selectivity of the material of the protective layer 25 to that of the first dielectric layer 21 in the second wet etching process is 20:1-40:1 such as 25:1, 30:1, or 35:1. The etchant used by the second wet etching process includes phosphoric acid solution. The phosphoric acid solution is generally used as an etchant for silicon nitride solution, which can remove the silicon nitride film well, and has little damage to the silicon oxide film.

Similarly, because the etch selectivity is related to the ambient temperature in the etching process. A lower ambient temperature indicates a higher etch selectivity and a smaller etch rate. Therefore, to alleviate the damage on the top surface and the sidewall of the first dielectric layer 21 caused by the second wet etching process, which may be performed at a relatively low ambient temperature such as 150° C.

In this embodiment, before the first wet etching process is performed, the protective layer is used to cover the sidewall of the first dielectric layer to avoid the damage on the sidewall of the first dielectric layer caused by the first wet etching process. In this case, the second etch selectivity is set greater than the first etch selectivity, to alleviate the damage on the surface of the first dielectric layer caused by the second wet etching process, so that the first dielectric layer has good structural properties.

Those of ordinary skill in the art should understand that the above embodiments are specific embodiments for implementing the present disclosure. In practical applications, various changes may be made to the above embodiments in terms of form and details without departing from the spirit and scope of the present disclosure. Any person skilled in the art may make changes and modifications to the embodiments without departing from the spirit and scope of the present disclosure. Therefore, the protection scope of the present disclosure should be subject to the scope defined by the claims.

The invention claimed is:

1. A manufacturing method of a semiconductor structure, comprising:
    providing a substrate;
    forming an insulating layer on the substrate, wherein the insulating layer comprises a first dielectric layer and a second dielectric layer, the insulating layer comprises a first trench, and the second dielectric layer covers an upper surface of the first dielectric layer; at least one side surface of the second dielectric layer is a curved surface;
    forming a protective layer, wherein the protective layer covers an upper surface of the second dielectric layer and a bottom and sidewalls of the first trench, the curved surface of the second dielectric layer helps improve the effective adhesion rate of the material of the protective layer;
    forming a second sacrificial layer, wherein the second sacrificial layer covers a surface of the protective layer and fills the first trench;
    etching part of the protective layer, part of the second dielectric layer and part of the second dielectric layer by using a dry etching process, wherein an upper surface of the remaining protective layer is flush with an upper surface of the remaining second dielectric layer, an upper surface of the remaining second sacrificial layer is lower than the upper surface of the remaining protective layer, and the protective layer exposes the upper surface of the second dielectric layer;
    removing part of the protective layer to expose at least part of a surface of the second dielectric layer;
    removing the second dielectric layer by using a first wet etching process, wherein the first wet etching process has a first etch selectivity of a material of the second dielectric layer to a material of the first dielectric layer; and
    removing the protective layer by using a second wet etching process, wherein the second wet etching process has a second etch selectivity of a material of the protective layer to the material of the first dielectric layer, and the second etch selectivity is greater than the first etch selectivity.

2. The manufacturing method of a semiconductor structure according to claim 1, wherein a material of the first dielectric layer is silicon oxynitride, a material of the second dielectric layer is silicon dioxide, and a material of the protective layer is silicon nitride.

3. The manufacturing method of a semiconductor structure according to claim 1, wherein the second etch selectivity is 2-8 times the first etch selectivity.

4. The manufacturing method of a semiconductor structure according to claim 3, wherein the first etch selectivity is 5:1-10:1.

5. The manufacturing method of a semiconductor structure according to claim 4, wherein an etchant used by the first wet etching process comprises ammonium hydrogen fluoride solution.

6. The manufacturing method of a semiconductor structure according to claim 3, wherein the second etch selectivity is 20:1-40:1.

7. The manufacturing method of a semiconductor structure according to claim 6, wherein an etchant used by the second wet etching process comprises phosphoric acid solution.

8. The manufacturing method of a semiconductor structure according to claim 1, wherein the forming an insulating layer on the substrate comprises:
    forming a first dielectric material layer and a first sacrificial layer sequentially stacked on the substrate, wherein the first sacrificial layer comprises a second trench;
    forming a second dielectric material layer, wherein the second dielectric material layer covers an upper surface of the first sacrificial layer and a bottom and sidewalls of the second trench;
    removing the second dielectric material layer on the upper surface of the first sacrificial layer, removing the second dielectric material layer at the bottom of the second trench, and forming, by the remaining second dielectric material layer, the second dielectric layer; and
    removing the first sacrificial layer, removing the first dielectric material layer exposed by the second dielectric layer, and forming, by the remaining first dielectric material layer, the first dielectric layer.

9. The manufacturing method of a semiconductor structure according to claim 8, wherein the first sacrificial layer comprises a material of the first dielectric material layer.

10. The manufacturing method of a semiconductor structure according to claim 8, wherein the first sacrificial layer comprises a first sacrificial sublayer and a second sacrificial sublayer, the first sacrificial sublayer is located between the second sacrificial sublayer and the first dielectric material layer, and materials of the second sacrificial sublayer and the first dielectric material layer are the same.

11. The manufacturing method of a semiconductor structure according to claim 8, wherein the second dielectric material layer is formed by using an atomic layer deposition process.

12. The manufacturing method of a semiconductor structure according to claim 8, wherein the forming a first sacrificial layer comprises:
    forming a first sacrificial material layer on the first dielectric material layer;
    forming a photoresist layer with a pattern opening on the first sacrificial material layer;
    etching and removing part of the first sacrificial material layer by using the photoresist layer as a mask;
    removing the photoresist layer; and
    forming, by the remaining first sacrificial material layer, the first sacrificial layer.

13. The manufacturing method of a semiconductor structure according to claim 1, before the removing the second dielectric layer, the method further comprises:
    removing the remaining second sacrificial layer.

14. The manufacturing method of a semiconductor structure according to claim 1, wherein a hardness of the material of the protective layer is greater than the material of the second dielectric layer.

15. The manufacturing method of a semiconductor structure according to claim 14, wherein a hardness of a material of the second sacrificial layer is smaller than the material of the second dielectric layer.

16. The manufacturing method of a semiconductor structure according to claim 1, wherein a material of the second sacrificial layer is carbon.

17. The manufacturing method of a semiconductor structure according to claim 16, wherein the second sacrificial layer is removed by using an ashing process.

18. The manufacturing method of a semiconductor structure according to claim 1, wherein the second wet etching process is performed at a process temperature lower than 150° C.

* * * * *